United States Patent
Veendrick

(10) Patent No.: US 7,478,302 B2
(45) Date of Patent: Jan. 13, 2009

(54) SIGNAL INTEGRITY SELF-TEST ARCHITECTURE

(75) Inventor: Hendricus Joseph Maria Veendrick, Eindhoven (NL)

(73) Assignee: NXP B.V., Eindhoven (NL)

( * ) Notice: Subject to any disclaimer, the term of this patent is extended or adjusted under 35 U.S.C. 154(b) by 195 days.

(21) Appl. No.: 10/557,679

(22) PCT Filed: May 18, 2004

(86) PCT No.: PCT/IB2004/050731

§ 371 (c)(1),
(2), (4) Date: Nov. 22, 2005

(87) PCT Pub. No.: WO2004/106957

PCT Pub. Date: Dec. 9, 2004

(65) Prior Publication Data

US 2007/0079188 A1    Apr. 5, 2007

(30) Foreign Application Priority Data

May 28, 2003   (EP)   .................................. 03101562

(51) Int. Cl.
*G01R 31/28* (2006.01)
(52) U.S. Cl. .................. 714/734; 714/733; 714/22; 714/30; 714/45; 714/46; 714/721; 714/724; 714/740; 714/745; 702/130; 702/183; 374/150
(58) Field of Classification Search .................. None
See application file for complete search history.

(56) References Cited

U.S. PATENT DOCUMENTS

| | | | | |
|---|---|---|---|---|
| 4,860,290 A | * | 8/1989 | Daniels et al. | 714/726 |
| 5,379,308 A | * | 1/1995 | Nhuyen et al. | 714/734 |
| 5,418,470 A | * | 5/1995 | Dagostino et al. | 324/763 |
| 5,459,737 A | * | 10/1995 | Andrews | 714/733 |
| 5,726,997 A | * | 3/1998 | Teene | 714/726 |
| 5,734,661 A | * | 3/1998 | Roberts et al. | 714/733 |

(Continued)

FOREIGN PATENT DOCUMENTS

EP          0650069 A2    4/1995

(Continued)

OTHER PUBLICATIONS

Ahmed N. et al.: "Extending JTAG for testing signal integrity in SoCs" Design Automation and Test in Europe Conference and Exhibition, Munich, Germany, Mar. 3-7, 2003, p. 218.

(Continued)

*Primary Examiner*—John P Trimmings
(74) *Attorney, Agent, or Firm*—Peter Zawilski

(57) ABSTRACT

A method suitable for testing an integrated circuit device is disclosed, the device comprising at least one module, wherein the at least one module incorporates at least one associated module monitor suitable for monitoring a device parameter such as temperature, supply noise, cross-talk etc. within the module.

39 Claims, 5 Drawing Sheets

U.S. PATENT DOCUMENTS

| | | | |
|---|---|---|---|
| 6,134,675 A * | 10/2000 | Raina | 714/37 |
| 6,421,626 B1 * | 7/2002 | Yin | 702/132 |
| 6,687,863 B1 * | 2/2004 | Inoue | 714/723 |
| 6,693,448 B1 * | 2/2004 | Okada et al. | 324/765 |
| 6,823,293 B2 * | 11/2004 | Chen et al. | 702/191 |
| 2001/0013791 A1 * | 8/2001 | Van Lammeren et al. | 324/765 |
| 2004/0059972 A1 * | 3/2004 | Khoche | 714/724 |

FOREIGN PATENT DOCUMENTS

| | | | |
|---|---|---|---|
| EP | 07647905 A1 | 4/1995 | |
| WO | WO9746891 | 11/1997 | |

OTHER PUBLICATIONS

Nourani M. et al. "Built-in Self-Test for Signal Integrity" Proceedings of the 38th. Anual Design Automation Conference. (DAC). Las Vegas,NV, Jun. 18-22, 2001, p. 792-797.

Tehranipour M.H. et al. "Testing SoC interconnects for signal integrity using boundary scan" Proceedings 21st IEEE VLSI Test Symposium Apr. 27, 2003, p. 158-163.

Caignet F. et al. "A Microelectronic test structure for signal integrity characterization in deep submicron technology" ICMTS 2000. Mar. 13, 2000, p. 67-74.

* cited by examiner

SIGNAL INTEGRITY SELF-TEST ARCHITECTURE

The invention relates generally to the field of integrated circuit architectures, and more specifically to the field of signal integrity self-test (SIST) architectures.

Advances in manufacturing technology have enabled larger and denser circuits to be placed on single semiconductor devices. This is especially the case when the circuits are realized as regular/cellular structures. One example of such cellular structure is a random access memory (RAM) device. RAM devices have some of the highest circuit densities. A major problem associated with such high-density devices is that of testing. In order to maintain high reliability, device test procedures need to provide good coverage of the possible faults that may occur on the device.

It is often the case that a device which is already installed and operating will need to be tested in order to ensure that it is operating properly. So-called 'at-speed' testing requires the use of high performance external ATE (automated test equipment). Such high performance ATE is specialized equipment and is therefore not common. In addition, it is often not convenient and, indeed, not possible to remove the device to be tested from its working place for testing it with external ATE. In the light of this drawback, various embedded test techniques have been employed. Such an embedded approach is commonly called "built-in self-test" (BIST). BIST usually makes use of one or more built-in linear feedback shift registers (LFSR) to generate test patterns and to analyze acquired signatures.

There are many types of BIST architectures which may be embedded into a device. For example, the BILBO (Built-In Logic Block Observer) architecture uses two LFSR's, one for test generation, and another for signature analysis. A second example is called CSTP (Circular Self-Test Path), and uses a single LFSR for both generation and analysis.

BIST methods may be performed 'on-line' or 'off-line'. On-line testing is performed while the device under test is in normal operation, and may be subdivided further into two categories: concurrent, and non-concurrent. On-line concurrent testing operates simultaneously with the normal operation of the device under test, whilst online non-concurrent testing operates when the device under test is in an idle state.

Off-line testing is performed when the device under test is in a separate, dedicated, test mode. Off-line testing can be categorized as functional, or structural off-line testing. Functional off-line testing is based upon a functional description of the device under test, whilst structural off-line testing is based upon the physical structure of the device under test.

FIGS. 1 and 2 represent a known approach to off-line structural testing using a BIST test architecture. In FIG. 1, a test signal 3 is fed into an input generator 5. The input generator 5 will generate a (pseudo-random) combination of test inputs to be fed into the device under test 7. The results are passed to an output analyzer 9, which determines whether the device under test 7 has passed or failed that particular test.

FIG. 2 illustrates the situation in which a device 16 comprises a number of individual circuits to be tested. A BIST controller 11 receives test information which is fed to a test-pattern generator 13. The test pattern generator 13 passes a test pattern to a distribution system 15 which in turn passes the test pattern to the circuits to be tested within the device 16. A collection system 17 passes the results of the tests to an output response analyzer 19 in order to determine if the result of the particular test corresponds to a pass or fail and for which circuits this result is applied. The BIST controller 11 controls the entire test process.

There is, however, a growing discrepancy between test results, and the behavior of devices in situ. The continuous scaling of semiconductor feature sizes and voltages has caused dramatic trends in the robustness of integrated circuit (IC) designs.

For example, the increase in the number of transistors and the increase in switching speed has dramatic effects on the timing and signal integrity by causing unacceptable levels of noise, such as for example cross-talk, supply noise, and substrate noise.

FIG. 3 illustrates two parallel traces (interconnects) A-B and C-D which may be used, for example, in the device 7 of FIG. 1. A signal $S(f)$ on a driven line 21 propagates from A to B. This signal is capacitively and inductively coupled to a second traceline 23. There is a mutual capacitive coupling signal, $S_C$, caused by capacitive coupling between the two traces 21, 23 which travels along the second trace line 23 in both the forward (C->D) and reverse (D->C) directions with the same polarity. There is also a mutual inductive coupling signal, $S_L$, caused by inductive coupling between the two traces 21, 23 which travels along the victim trace line 23 in the forward (C->D) direction with one polarity and in the reverse (D->C) direction with the opposite polarity.

In homogeneous materials the mutual capacitance and mutual forward inductance are approximately equal and tend to cancel one another. They are, however, additive in the reverse direction, and cause significant problems in signal integrity.

As the signal frequency, f, (or the frequency components of the harmonics of the underlying signal $S(f)$) increases, and the separation, x, between traces decreases, cross-talk increases, which leads to performance degradation of the device in question due to excessive signal delays.

In addition to the above, the reduction of supply and threshold voltages causes a reduction in noise margins, leading to further difficulties in the test and operation of devices.

In addition to built-in self-tests, boundary scan tests may also be performed on devices, using for example, the IEEE 1149.1 protocol. Boundary scan tests rely on embedded test circuitry at chip level which form a complete board-level test protocol. However, not every logic, memory and/or analogue block may have direct access to the pins of a design meaning that a complete functional test may not be performed. Scan tests may therefore show different switching activities than in a real application, meaning that the chip may operate correctly during the test and fail in the application, or vice-versa.

FIG. 4 shows the typical layout of a scan test in accordance with the IEEE 1149.1 test protocol. In a boundary scan device, each digital primary input signal and primary output signal is supplemented with a memory element called a boundary scan cell (e.g. 35 of FIG. 4). Cells on device primary inputs are referred to as input cells, and cells on device primary outputs are referred to as output cells. The collection of boundary scan cells is arranged into a parallel-in, parallel-out shift register as depicted in FIG. 4. A parallel load operation causes signal values on device input pins to be loaded into input cells, and signal values passing from the internal logic to device output pins are loaded into output cells.

Data can be shifted around the shift register starting from a dedicated device input pin 25 called 'Test Data In' (TDI) and terminating at a dedicated device output pin 27 called 'Test Data Out' (TDO). FIG. 5 shows a diagrammatic representation of a typical boundary scan cell 35. Each cell may capture data on its parallel input PI, update data onto its parallel output PO, serially scan data from SO to its neighbor SI, or behave transparently: PI passes to PO.

For complex chip architectures, boundary scan cells may not have access to all of the internal functionality of an IC core. Therefore, as explained above, complete functional testing may not be possible using this method (or the BIST methodology), especially as chip architectures become more complex, and device features continue to become smaller. There therefore exists a need to obtain a way for the complete functional testing of devices whilst continuing to allow the scaling of semiconductor feature sizes and voltages. The present invention employs an architecture which allows the complete monitoring of important chip parameters or characteristics which affect signal integrity. The architecture allows any location on a chip to be monitored (e.g. every core), and the monitoring may take place at any time: during testing, debug, diagnosis and product engineering and whilst in application.

According to one aspect of the present invention there is provided a method of testing an integrated circuit device comprising at least one module, wherein the or each module incorporates a module monitor operable to produce a measurement signal indicative of an operating parameter of the module concerned, the method including receiving a measurement signal from a module monitor and processing that received signal to produce a test result.

According to a second aspect of the present invention there is provided a method of testing an integrated circuit device comprising at least one module, wherein the or each module incorporates a plurality of module monitors operable to produce respective measurement signals indicative of respective operating parameters of the module concerned, the method including receiving a measurement signal from a module monitor and processing that received signal to produce a test result.

According to a third aspect of the present invention there is provided an integrated circuit device comprising a module, which incorporates a module monitor operable to produce a measurement signal indicative of an operating parameter of the module.

According to a fourth aspect of the present invention there is provided an integrated circuit device comprising a module, which incorporates a plurality of module monitors operable to produce respective measurement signals indicative of respective operating parameters of the module.

According to a fifth aspect of the present invention there is provided apparatus for testing an integrated circuit device, the device comprising a module, which incorporates a module monitor operable to produce a measurement signal indicative of an operating parameter of the module.

According to a sixth aspect of the present invention there is provided apparatus for testing an integrated circuit device, the device comprising a module, which incorporates a plurality of module monitors operable to produce respective measurement signals indicative of respective operating parameters of the module.

It should be emphasized that the term "comprises/comprising" when used in this specification is taken to specify the presence of stated features, integers, steps or components but does not preclude the presence or addition of one or more other features, integers, steps, components or groups thereof.

For a better understanding of the present invention and to show how the same may be carried into effect reference will now be made, by way of example, to the accompanying drawings, in which.

Figure 1:
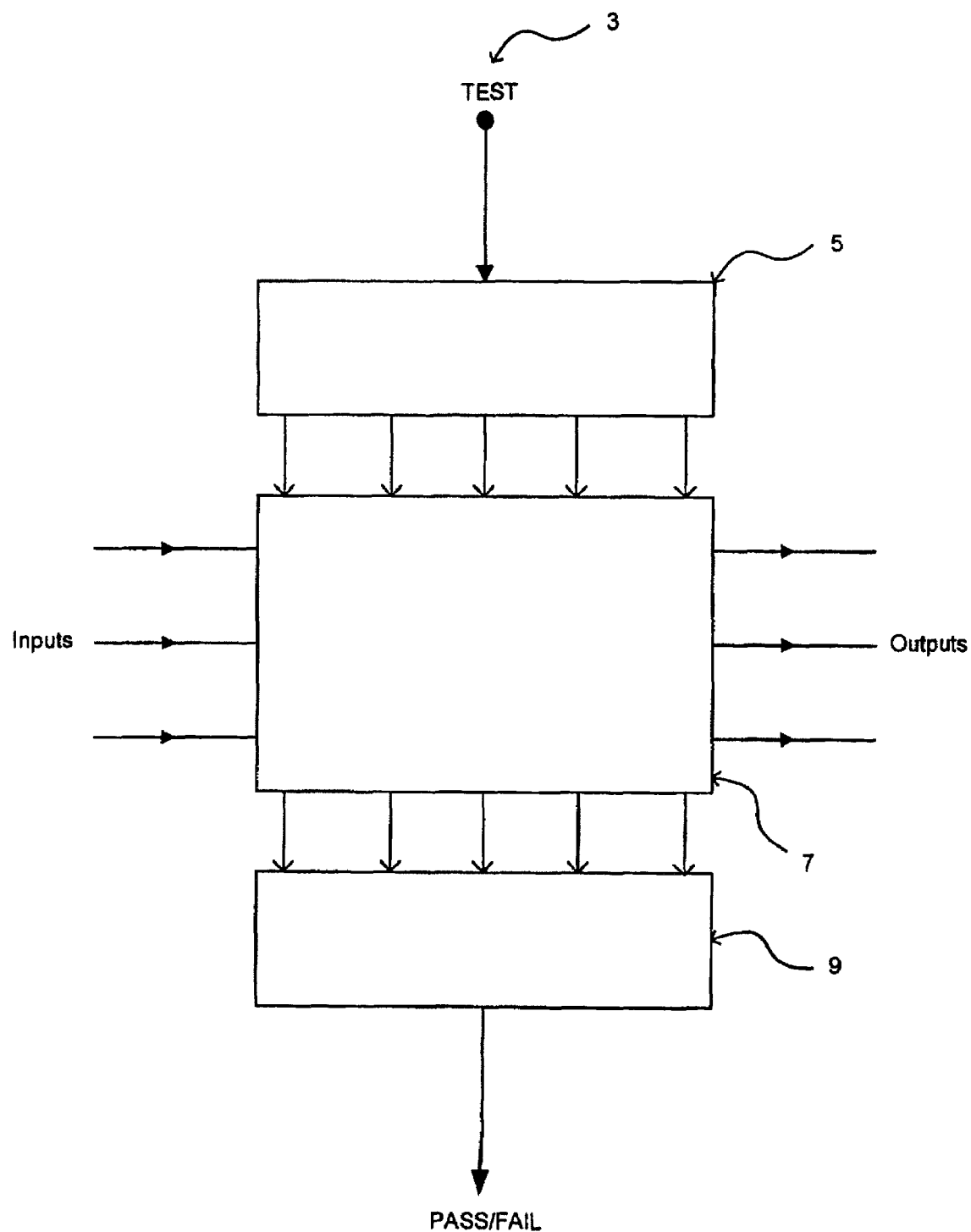
FIG. 1 is a diagrammatic representation of a typical off-line BIST architecture.
Figure 2:
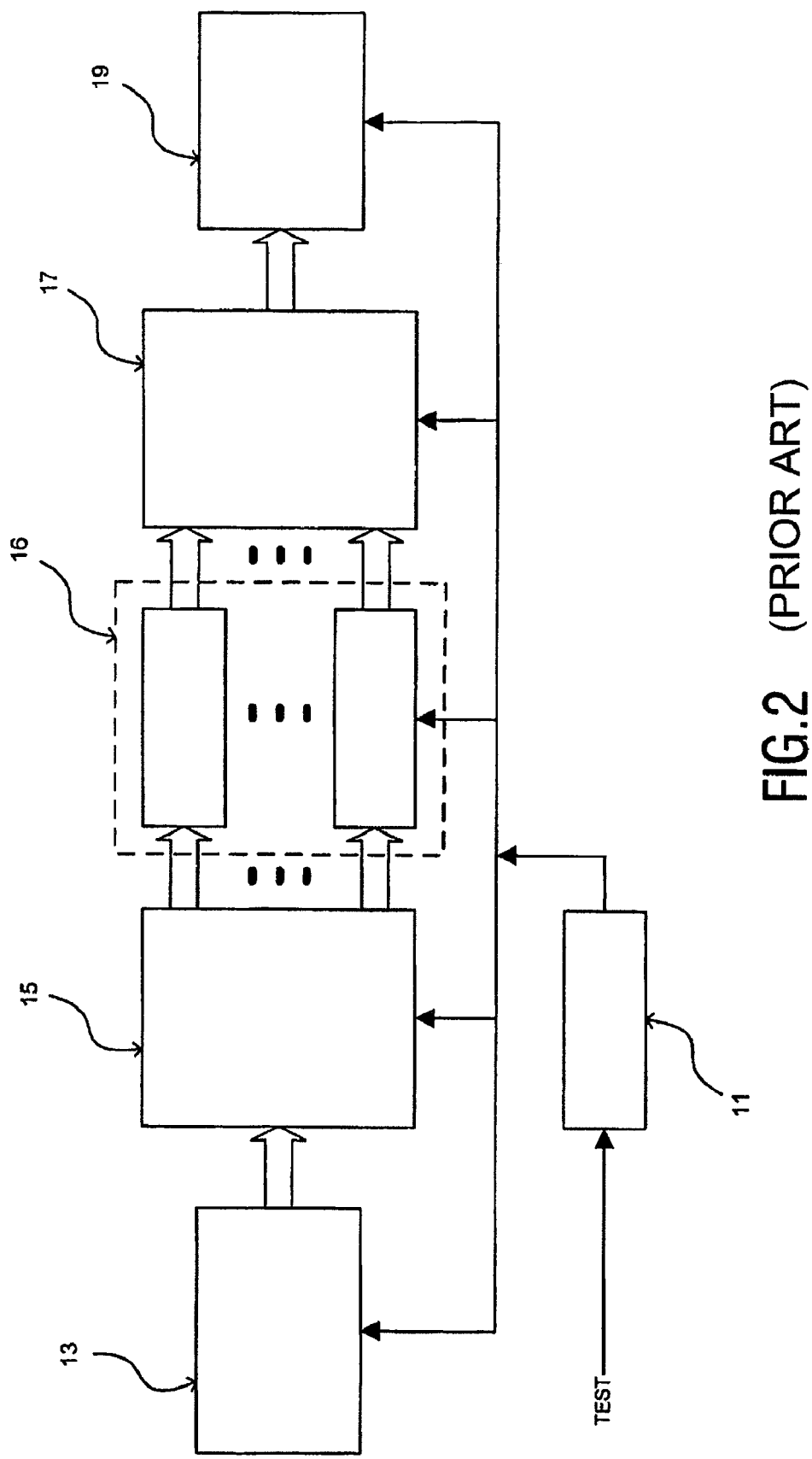
FIG. 2 is a further diagrammatic representation of a typical off-line BIST architecture.
Figure 3:
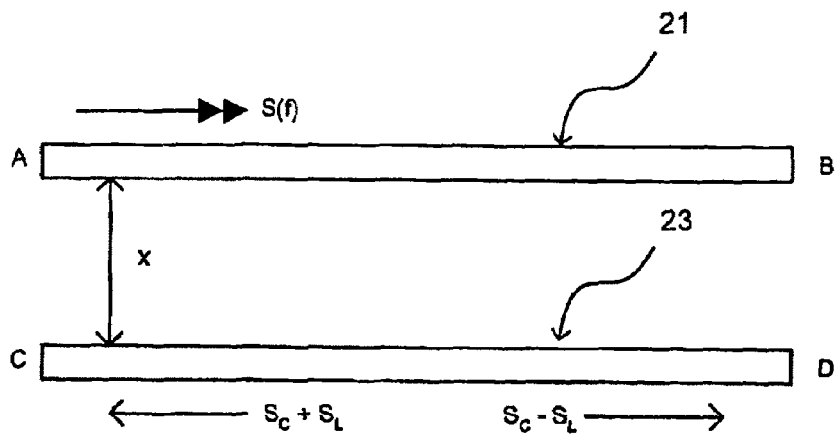
FIG. 3 is a diagrammatic representation of two parallel tracelines.
Figure 4:
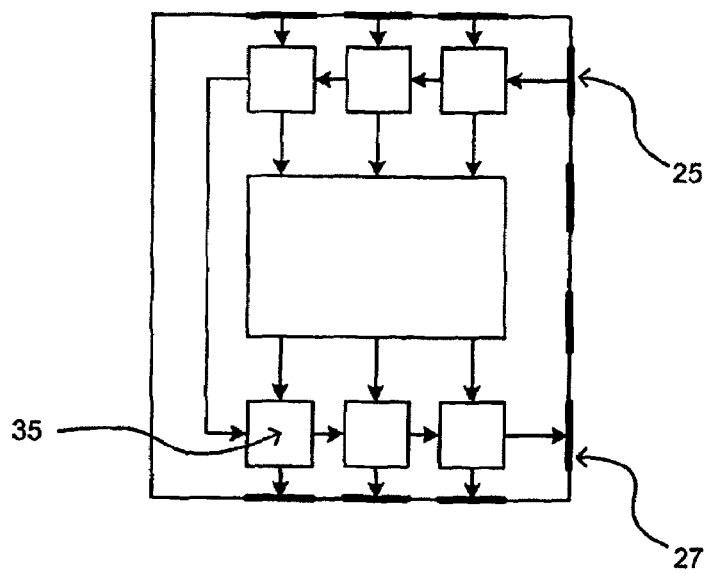
FIG. 4 is a diagrammatic representation of a typical boundary scan test architecture.
Figure 5:
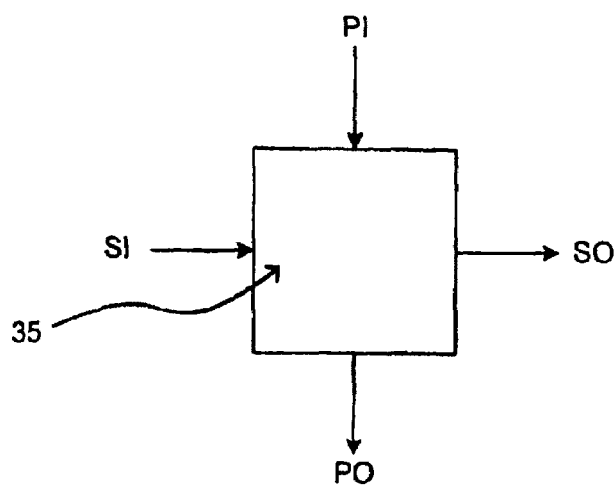
FIG. 5 represents an element of a typical boundary scan test architecture.
Figure 6:
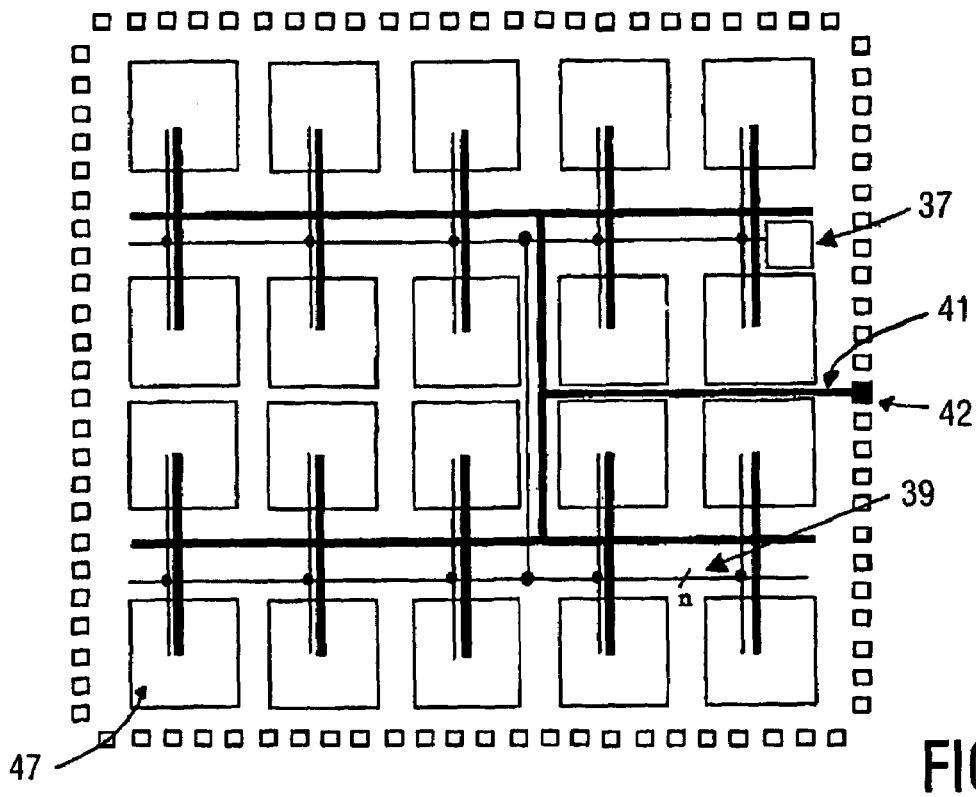
Figure 7:
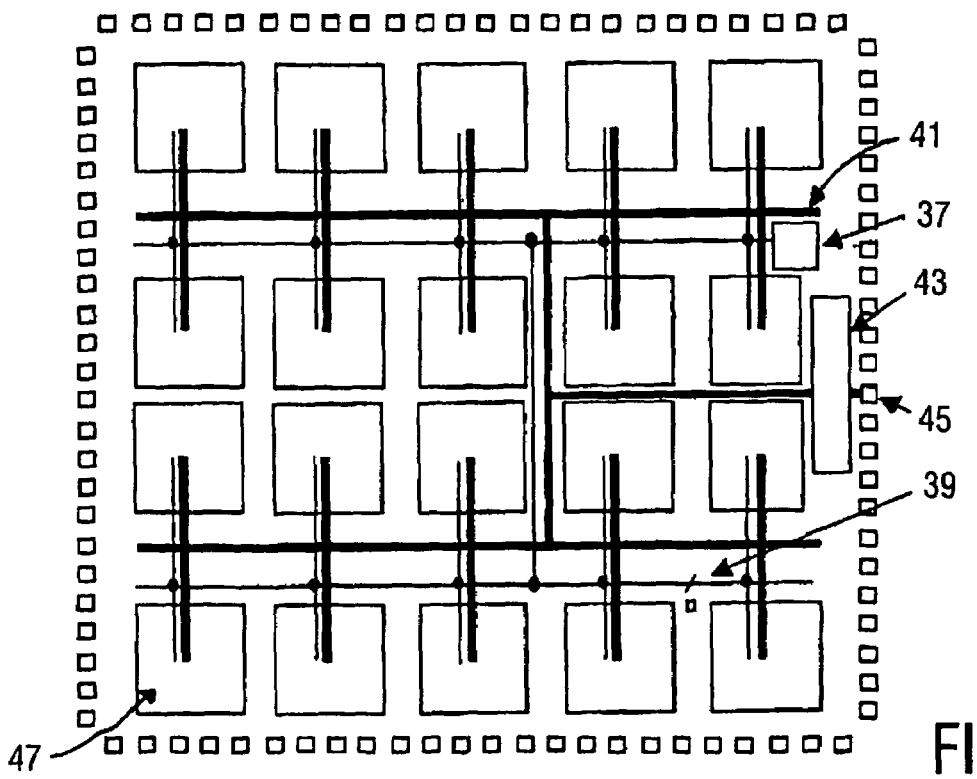
Figure 8:
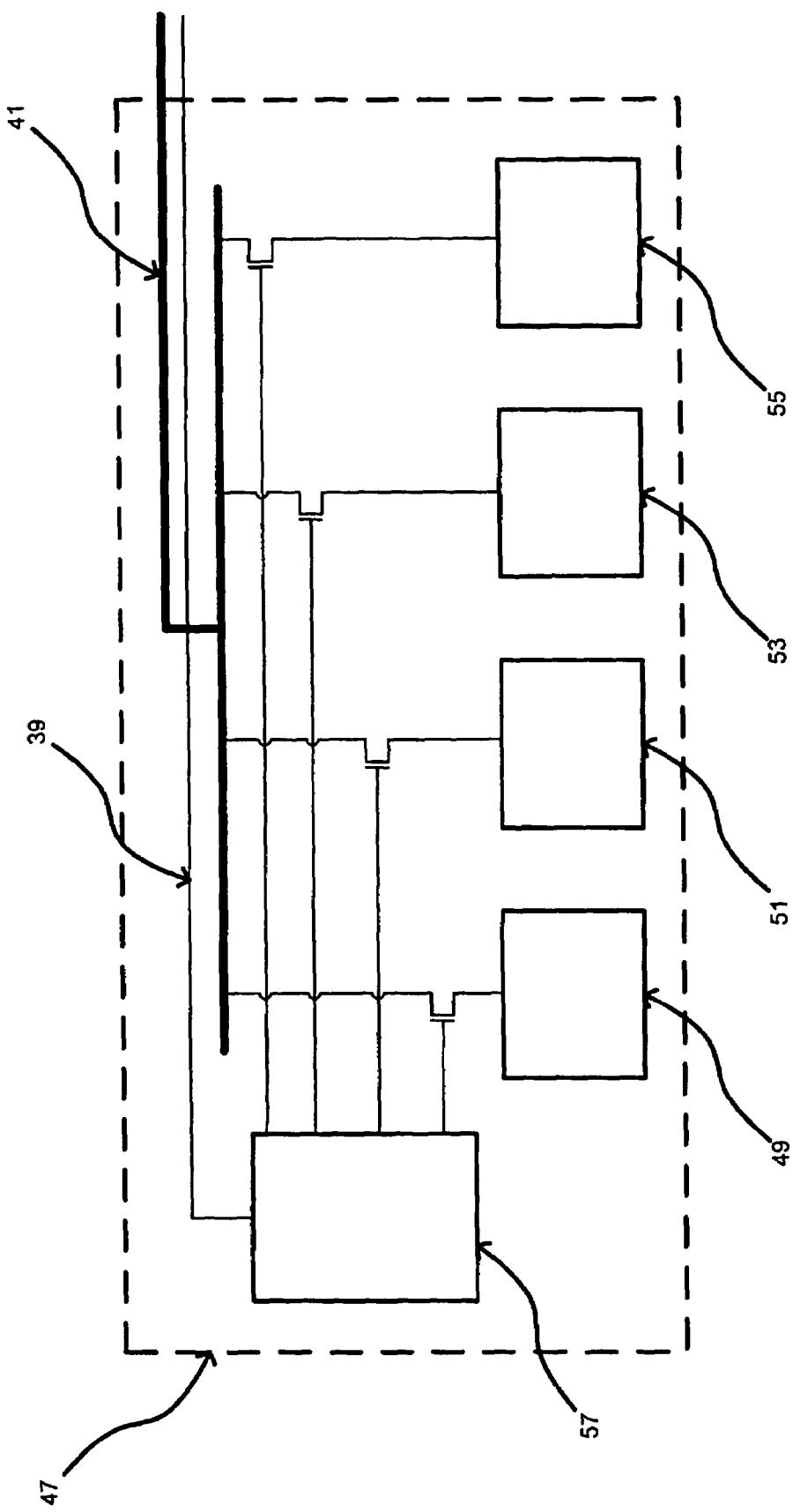

FIG. 6 diagrammatically represents an integrated circuit device embodied by the present invention;

FIG. 7 diagrammatically represents an integrated circuit device embodied by the present invention; and FIG. 8 is a diagrammatic representation of a device core associated with an embodiment of the present invention.

FIG. 6 represents an exemplary embodiment of the present invention. The device under test has a plurality of cores (or modules) 47. For simplicity, it has been assumed that all cores on the device under test have the same size. This results in a regular architecture as can be seen from FIG. 6. The cores 47 are functional blocks within the device under test. The cores 47 can have different functions, and be of different sizes to one another and the internal logic of each core 47 may be implemented from elements of a standard cell library for example.

The FIG. 6 device is merely shown as an example to illustrate the invention. The FIG. 6 device includes a monitor selection bus 39 which is connected to respective monitors or groups of monitors in the cores 47 via a decoder 57 (FIG. 8). The cores 47 may be, for example, a memory module, or may be part of an analogue or digital module. An IC may comprise a large number of such cores. The monitors are not shown in FIG. 6 for the sake of clarity (see FIG. 8). It should also be appreciated that, particularly in the case where monitors have a similar architecture to the elements in a standard cell library from which the logic of a core 47 is built up (as mentioned above), monitors may easily be placed into the architecture of a core 47, and a core may contain significantly more monitors than as described herein.

The monitors are connected to a monitoring signal line (or bus) 41 on which monitor signals are transmitted. A monitor control block 37 controls values of bits on the monitor selection bus 39 so as to select which monitor in which core 47 is connected to the monitoring signal line 41. The level of the signal on this line relates to the output of the selected monitor parameter in the selected core. In the embodiment of FIG. 6, the signal is routed to a bond pad 42 for output from the device for processing. Alternatively, a reference and compare circuit 43 can be provided which contains (for each individual parameter) a reference value which is compared with the monitor output and generates a pass or fail signal. A reference and compare circuit 43 is depicted in FIG. 7. In this way, the chip may perform a signal integrity self-test. Monitoring signals in each core may include temperature, cross talk, supply noise and matching for example.

FIG. 8 represents a more detailed view of the monitors 49, 51, 53, 53 in a core 47 of FIGS. 6 and 7. In this example, the core 47 has four monitors 49, 51, 53, 55. The number of monitors provided in each core is not important for the present invention. Different cores can have different numbers of monitors, and as mentioned above, the number may be significantly larger than that described herein.

The logic within the core 47 may be implemented using logic elements from a standard cell library. In this case it is preferable that monitors are architecturally similar to the logic elements within the standard cell library. For instance, elements in a library may all have a set height and variable width. It is therefore preferable that monitors implemented in a core 47 built, for example, from such a library have the same height. In this way monitors may easily be implemented into a design built using elements from such standard cell libraries.

The number of monitors in each core 47 will determine the number of bits required in the monitor selection bus 39. In the case of four monitors in a core, the monitor selection bus 39 would contain two bits per core in order to be able to select the appropriate monitor. The monitor selection bus 39 receives data from the monitor control block 37, and the decoder 57 (FIG. 8) decodes the data (which may be for example a binary identifier corresponding to the monitor to be selected). The decoder 57 selects the appropriate monitor 49, 51, 53, 55 based upon the data received from the monitor control block 37. The monitor control block 37 may be pre-programmed to automatically initiate a SIST under certain circumstances, or may receive an external prompt in order to initiate one. The prompt may include information on which monitors in which cores are to be selected, thereby allowing the monitor control block 37 to send the relevant information on the monitor selection bus 39 to a decoder 57. Each decoder 57 in each core 47 decodes the information sent on the monitor selection bus 39 by the monitor control block 37 in order to determine whether a monitor it controls is being requested to perform its monitoring function.

Each monitor may be assigned to examine a specific chip (or core) parameter such as temperature, cross talk, supply noise or matching for example. Alternatively, the monitors may examine the same parameter across the chip (or core) in order to determine the effect of the particular parameter in relation to the dimensions of the core. A combination of the two approaches may be employed. So, for example and with reference to FIG. 8, a core 47 could have multiple monitors (49, 51, 53, 55) examining the temperature of the core at different positions therein, and/or multiple monitors each examining one of temperature, cross-talk, supply noise and matching for example, or a combination thereof.

Those skilled in the art will appreciate that any appropriate combination of core parameters may be examined by the architecture embodied by the present invention. Once a particular core parameter or characteristic has been examined, the results of the examination are passed by the monitor 49, 51, 53, 55 to the monitoring signal line (or bus) 41. This signal line/bus 41 may be a single line carrying a DC signal whose level is the value for the measured parameter (e.g. cross-talk, supply noise, activity, temperature etc.). It may also support differential signaling to prevent the monitoring signal in question becoming infected by on-chip noise. Alternatively, the measured parameter may be passed by binary coding its value directly after the monitor (sensor), and then sending the binary coded value through a bus. The results may then be processed accordingly, either off-chip via a bondpad 42 or on-chip via the reference and compare circuit 43. Any necessary action can then be taken with regard to the results of the processing. The results from the reference and compare circuit 43 may be passed to a bondpad 45 to enable further off-chip processing to be carried out. As mentioned above, there is a growing discrepancy between test results obtained using for example, BIST, and the behavior of devices in application. The signal integrity self-test (SIST) described above may advantageously complement BIST. For example, SIST may be used to provide information about various device parameters before, during and/or after a built-in self-test has been carried out.

The invention claimed is:

1. A method of testing an integrated circuit device comprising a module, a module monitor incorporated into the module and being operable to produce a measurement signal indicative of an operating parameter of the module concerned, the method including receiving the measurement signal from the module monitor and processing that received signal to produce a test result, the operating parameter of the module concerned including one or more of temperature, cross-talk, supply noise, or matching.

2. The method as claimed in claim 1, wherein receiving the measurement signal includes receiving the measurement signal at a compare and reference circuit.

3. The method as claimed in claim 1, wherein receiving the measurement signal includes receiving the measurement signal at a bond pad of the integrated circuit device.

4. The method as claimed in claim 1, wherein processing the received signal includes comparing the received signal with a reference value.

5. The method as claimed in claim 4, further including generating a pass/fail signal in response to comparing the received measurement signal with the reference value.

6. A method of testing an integrated circuit device comprising a module and a plurality of module monitors incorporated into the module, each module monitor being operable to produce respective measurement signals indicative of respective operating parameters of the module concerned, the method including receiving at least one of the respective measurement signals from a corresponding module monitor and processing that received respective signal to produce a test result, the respective operating parameter including one or more of temperature, cross-talk, supply noise, or matching.

7. The method as claimed in claim 6, wherein receiving the respective measurement signal includes receiving the respective measurement signal at a compare and reference circuit.

8. The method as claimed in claim 6, wherein receiving the respective measurement signal includes receiving the respective measurement signal at a bondpad of the integrated circuit device.

9. The method as claimed in claim 6, wherein processing the received respective signal includes comparing the received respective signal with a reference value.

10. The method as claimed in claim 9, further including generating a pass/fail signal in response to comparing the received respective measurement signal with the reference value.

11. An integrated circuit device comprising one or more modules, into each of which is incorporated one or more module monitors each operable to produce a measurement signal indicative of an operating parameter of the module, the operating parameter including one or more of temperature, cross-talk, supply noise, or matching.

12. The integrated circuit device as claimed in claim 11, further comprising a monitor selection bus operable to select from among the one or more module monitors in the one or more modules.

13. The integrated circuit as claimed in claim 12, further comprising a monitor control block operable to control values on the monitor selection bus.

14. The integrated circuit as claimed in claim 11, further comprising a reference and compare circuit connected to receive output signals from selected module monitors.

15. The integrated circuit as claimed in claim 11, wherein the one or more module monitors have a standard cell architecture.

16. An integrated circuit device comprising a module, into which is incorporated a plurality of module monitors operable to produce respective measurement signals indicative of respective operating parameters of the module, the respective operating parameters including one or more of temperature, cross-talk, supply noise, or matching.

17. The integrated circuit as claimed in claim 16, further comprising a monitor selection bus operable to select respective module monitors.

18. The integrated circuit as claimed in claim 17, further comprising a monitor control block operable to control values on the monitor selection bus.

19. The integrated circuit as claimed in claim 16, further comprising a reference and compare circuit connected to receive output signals from selected module monitors.

20. The integrated circuit as claimed in claim 16, wherein at least one of the module monitors has a standard cell architecture.

21. An apparatus for testing an integrated circuit device, the device comprising one or more modules into each of which is incorporated one or more module monitors each operable to produce a measurement signal indicative of an operating parameter of the module, the operating parameter including one or more of temperature, cross-talk, supply noise, or matching.

22. The apparatus as claimed in claim 21, further comprising a monitor selection bus operable to select from among respective monitors in respective modules.

23. The apparatus as claimed in claim 22, further comprising a monitor control block operable to control values on the monitor selection bus.

24. The apparatus as claimed in claim 21, further comprising a reference and compare circuit connected to receive output signals from selected module monitors.

25. The apparatus as claimed in claim 21, wherein at least one of the module monitors has a standard cell architecture.

26. An apparatus for testing an integrated circuit device, the device comprising a module into which is incorporated a plurality of module monitors operable to produce respective measurement signals indicative of respective operating parameters of the module, the respective operating parameters including one or more of temperature, cross-talk, supply noise, or matching.

27. The apparatus as claimed in claim 26, further comprising a monitor selection bus operable to select respective module monitors.

28. The apparatus as claimed in claim 27, further comprising a monitor control block operable to control values on the monitor selection bus.

29. The apparatus as claimed in claim 26, further comprising a reference and compare circuit connected to receive output signals from selected module monitors.

30. The apparatus as claimed in claim 26, wherein at least one of the module monitors has a standard cell architecture.

31. An integrated circuit device having self-test architecture, the integrated circuit comprising:
   a plurality of functional blocks, each functional block incorporating one or more monitors operable to produce respective measurement signals indicative of respective operating parameters of the functional block, and a decoder to select from among the one or more monitors;
   a monitor control block coupled to each decoder of each functional block via a monitor selection bus, the monitor control block operable to signal selection of any of the respective monitors by each respective decoder; and
   a reference and compare circuit to receive and process the respective measurement signals.

32. The integrated circuit device of claim 31, wherein the respective operating parameters include one or more of temperature, cross-talk, supply noise, or matching.

33. The integrated circuit device of claim 31, wherein at least one of the functional blocks incorporates a plurality of the monitors, each of the plurality of the monitors producing respective measurement signals indicative of different operating parameters.

34. The integrated circuit device of claim 31, wherein at least one of the functional blocks incorporates a plurality of the monitors, each of the plurality of the monitors producing respective measurement signals indicative of the same operating parameters at different positions across the functional block.

35. The integrated circuit device of claim 31, wherein the monitor control block signals selection automatically under determined circumstances.

36. The integrated circuit device of claim 31, wherein at least one of the functional blocks is a memory module.

37. The integrated circuit device of claim 31, wherein the monitor selection bus has a bit capacity determined in accordance with the largest number of monitors incorporated into any of the functional blocks.

38. The integrated circuit device of claim 31, wherein at least one functional block incorporates four or more monitors.

39. The integrated circuit device of claim 31, wherein at least two of the functional blocks incorporate a different number of monitors.

* * * * *